(12) United States Patent
Xiao et al.

(10) Patent No.: US 11,859,094 B2
(45) Date of Patent: *Jan. 2, 2024

(54) THERMAL SUBSTRATE WITH HIGH-RESISTANCE MAGNIFICATION AND POSITIVE TEMPERATURE COEFFICIENT INK

(71) Applicant: LMS Consulting Group, LLC, Marion, OH (US)

(72) Inventors: Shuyong Xiao, St-Laurent (CA); Richard C. Abbott, New Boston, NH (US)

(73) Assignee: LMS Consulting Group, LLC, Marion, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/743,757

(22) Filed: May 13, 2022

(65) Prior Publication Data

US 2022/0267633 A1 Aug. 25, 2022

Related U.S. Application Data

(63) Continuation of application No. 17/147,901, filed on Jan. 13, 2021, now Pat. No. 11,332,632, which is a
(Continued)

(51) Int. Cl.
*C09D 11/52* (2014.01)
*C09D 11/102* (2014.01)
(Continued)

(52) U.S. Cl.
CPC ............ *C09D 11/52* (2013.01); *C09D 11/037* (2013.01); *C09D 11/10* (2013.01); *C09D 11/102* (2013.01);
(Continued)

(58) Field of Classification Search
None
See application file for complete search history.

(56) References Cited

U.S. PATENT DOCUMENTS

| 4,628,187 A | 12/1986 | Sekiguchi et al. |
| 4,668,857 A | 5/1987 | Smuckler |

(Continued)

FOREIGN PATENT DOCUMENTS

| CN | 103965696 A | 8/2014 |
| EP | 0311142 A2 | 4/1989 |

(Continued)

OTHER PUBLICATIONS

International Search Report and Written Opinion of ISA for International Application No. PCT/US2017/19440, dated Feb. 24, 2017; 15pp.

(Continued)

*Primary Examiner* — Katie L. Hammer
(74) *Attorney, Agent, or Firm* — Stratford Group Ltd.

(57) ABSTRACT

An article comprising a heater that comprises a high-resistance magnification (HRM) PTC ink deposited on a flexible substrate to form one or more resistors. The HRM PTC ink has a resistance magnification of at least 20 in a temperature range of at least 20 degrees Celsius above a switching temperature of the ink, the resistance magnification being defined as a ratio between a resistance of the double-resin ink at a temperature 'T' and a resistance of the double-resin ink at 25 degrees Celsius.

11 Claims, 12 Drawing Sheets

Related U.S. Application Data continuation-in-part of application No. 17/034,653, filed on Sep. 28, 2020, now Pat. No. 11,136,467, which is a continuation of application No. 16/041,076, filed on Jul. 20, 2018, now Pat. No. 10,822,512, which is a continuation-in-part of application No. 15/143,524, filed on Apr. 30, 2016, now Pat. No. 10,077,372.

(60) Provisional application No. 62/389,396, filed on Feb. 24, 2016.

(51) Int. Cl.
| | |
|---|---|
| *H05B 3/14* | (2006.01) |
| *H05K 1/09* | (2006.01) |
| *C09D 11/107* | (2014.01) |
| *H05K 1/02* | (2006.01) |
| *C09D 11/10* | (2014.01) |
| *H05B 3/34* | (2006.01) |
| *H05K 1/03* | (2006.01) |
| *C09D 11/037* | (2014.01) |
| *H05B 3/10* | (2006.01) |
| *H05K 1/16* | (2006.01) |
| *H05K 3/12* | (2006.01) |

(52) U.S. Cl.
CPC ............ *C09D 11/107* (2013.01); *H05B 3/10* (2013.01); *H05B 3/146* (2013.01); *H05B 3/34* (2013.01); *H05K 1/0212* (2013.01); *H05K 1/038* (2013.01); *H05K 1/095* (2013.01); *H05K 1/097* (2013.01); *H05B 2203/011* (2013.01); *H05B 2203/013* (2013.01); *H05B 2203/02* (2013.01); *H05B 2203/036* (2013.01); *H05K 1/162* (2013.01); *H05K 3/12* (2013.01); *H05K 2201/10196* (2013.01)

(56) References Cited

U.S. PATENT DOCUMENTS

| | | | |
|---|---|---|---|
| 4,785,163 A | 11/1988 | Sandberg | |
| 4,845,343 A | 7/1989 | Aune et al. | |
| 5,068,518 A | 11/1991 | Yasuda | |
| 5,093,036 A | 3/1992 | Shafe et al. | |
| 5,166,658 A | 11/1992 | Fang et al. | |
| 5,181,006 A | 1/1993 | Shafe et al. | |
| 5,198,639 A | 3/1993 | Smuckler | |
| 5,227,946 A | 7/1993 | Jacobs et al. | |
| 5,344,591 A | 9/1994 | Smuckler | |
| 5,451,919 A | 9/1995 | Chu et al. | |
| 5,580,493 A | 12/1996 | Chu et al. | |
| 5,714,096 A | 2/1998 | Dorfman | |
| 5,747,147 A | 5/1998 | Wartenberg et al. | |
| 5,902,518 A | 5/1999 | Khazai et al. | |
| 5,993,698 A | 11/1999 | Frentzel et al. | |
| 6,479,575 B1 | 11/2002 | Chu et al. | |
| 8,496,854 B2 | 7/2013 | Mercx et al. | |
| 2002/0014477 A1 | 2/2002 | Lee et al. | |
| 2002/0128333 A1 | 9/2002 | Tang et al. | |
| 2005/0173414 A1 | 8/2005 | Ishil et al. | |
| 2006/0152329 A1 | 7/2006 | Bjorsell | |
| 2010/0038025 A1 | 2/2010 | Keite-Telgen-Buscher et al. | |
| 2010/0038357 A1 | 2/2010 | Fukuda et al. | |
| 2010/0136315 A1 | 6/2010 | Yamada | |
| 2011/0127248 A1 | 6/2011 | Moreshead | |
| 2011/0172750 A1 | 7/2011 | Cassidy et al. | |
| 2011/0263781 A1 | 10/2011 | Arancio et al. | |
| 2012/0241685 A1 | 9/2012 | Wu et al. | |
| 2013/0140499 A1 | 6/2013 | Seong-Hoon et al. | |
| 2015/0195870 A1 | 7/2015 | Chabach et al. | |
| 2015/0221452 A1 | 8/2015 | Ida et al. | |
| 2015/0361287 A1 | 12/2015 | Xiao et al. | |
| 2016/0358849 A1 | 12/2016 | Jur et al. | |
| 2017/0158898 A1 | 6/2017 | Xiao et al. | |

FOREIGN PATENT DOCUMENTS

| | | |
|---|---|---|
| JP | 11310739 A | 11/1999 |
| JP | 2001202821 A | 7/2001 |
| JP | 2008293672 A | 12/2008 |
| JP | 2009151976 A | 7/2009 |
| JP | 2009199794 A | 9/2009 |
| WO | 2009040774 A1 | 4/2009 |
| WO | 2014001414 A1 | 1/2014 |
| WO | 20170147480 A1 | 8/2017 |

OTHER PUBLICATIONS

Extended European Search Report issued in respect of EP 17757340.9, dated Oct. 1, 2019; 10pp.

International Search Report from corresponding International Application No. PCT/IB2019/056207, dated Dec. 13, 2019, 3 pp.

THERMAL SUBSTRATE WITH HIGH-RESISTANCE MAGNIFICATION AND POSITIVE TEMPERATURE COEFFICIENT INK

CROSS-REFERENCE TO RELATED APPLICATIONS

This application is a continuation of U.S. patent application Ser. No. 17/147,901 filed Jan. 13, 2021 (now allowed), which is a continuation-in-part of U.S. patent application Ser. No. 17/034,653 filed Sep. 28, 2020 (issued as U.S. Pat. No. 11,136,467 on Oct. 5, 2021), which is a continuation of U.S. patent application Ser. No. 16/041,076 filed Jul. 20, 2018 (issued as U.S. Pat. No. 10,822,512 on Nov. 3, 2020), which is a continuation-in-part of U.S. patent application Ser. No. 15/143,524 filed Apr. 30, 2016 (issued as U.S. Pat. No. 10,077,372 on Sep. 18, 2018), which claims the benefit of U.S. Provisional Application No. 62/389,396, filed Feb. 24, 2016, each of which is hereby incorporated by reference herein in its entirety.

TECHNICAL FIELD

The present disclosure relates to the field of PTC inks. It relates to applications that use PTC inks exhibiting switching characteristics, high resistance magnification and the delayed onset of NTC behavior in a temperature range relevant to a particular application.

BACKGROUND

The terms positive temperature coefficient (PTC) materials and positive temperature coefficient of resistivity (PTCR) materials, as used herein, refer to materials that increase resistivity nonlinearly when their temperature is raised. Reference may be made, for example, to U.S. Pat. Nos. 4,628,187, 5,181,006, 5,344,591, and 5,714,096, and Japanese Patent Publication Nos. 2008293672, 2009151976, and 2009199794. The temperature where the resistance increases nonlinearly, thereby reducing current, is referred to herein as the switch temperature.

Polymers can be made electrically conductive by dispersing suitable amounts of conductive particles such as carbon black or fine metal particles. A sub-class of electrically conductive polymers can be made to exhibit PTC behavior. Polymeric compositions exhibiting PTC behavior and devices incorporating the same have been used in many applications, especially in the electronics industries. A common use in an electronic circuit is limitation of current which is controlled by the temperature of a PTC element forming part of the circuit. An increasing use of PTC materials is for constant temperature heaters.

However, carbon-based polymeric PTC materials suffer from several important operational technical problems. For example, most PTC compositions exhibit Negative Temperature Coefficient (NTC) characteristics of resistivity immediately after the PTC characteristics. This change from PTC behavior to a strong NTC behavior is often undesirable and may cause self-burning in some cases. The lower resistance at the onset of NTC leads to excessive current flow and the resistor, or heater, is overpowered. Therefore, the NTC temperature region is a potential safety-risk temperature region. Various efforts have been made to reduce the NTC effect as described in U.S. Pat. Nos. 8,496,854 and 5,227,946 and European Pat. EP 0311142. However, the NTC effect is only reduced and not eliminated.

Another problem with current polymeric PTC materials is a low resistance magnification at the switch temperature, typically ranging from 5-15. This results in some power dissipation even at maximum resistance which results in poor temperature regulation.

Another problem is the transition temperature region between the low resistance state and the high resistance state where only partial current flows. The transition region varies in width proportional to ambient temperature and the overall conditions for heat transfer. Therefore, the operational characteristics of the heater are determined by many design factors involving its physical environment. This affects the heater's power dissipation, the time-to-switch and the heater's hold current.

Still another problem is that many PTC materials exhibit resistance hysteresis when switched. This is observed as a partial resistance increase over the starting resistance even hours after the switch event. In time, the original resistance is approached but it may be days, months, or years. Fortunately, the resistance is not cumulative over subsequent switch events so strategies can be taken to account for this phenomenon.

Yet another problem is the PTC material's resistance recovery time after a reset event. The time is usually one to two minutes but can be longer depending on the heat transfer environment of the heater and its material design.

One application for PTC inks is electrically heated fabrics. Electrically heated fabrics are used commonly in clothing for outdoor activities, medical devices, and some industrial applications. The term fabric as used herein refers to a woven material comprising threads or yarns or a non-woven material such as thermoplastic polyurethane when used as part of a garment. One class of heated fabrics utilizes heating elements of nickel-chromium or other resistive alloy in foil or wire form with a battery as a portable energy source. Another class uses polymer films with electrically conductive polymers deposited on a film as described in U.S. Pat. No. 9,161,393 B2. In yet another class, Pat. No. CN 104,476,890 B describes printing directly on the fabric using screen printing.

In all cases but the last, the heating elements, placed adjacent to or attached to the fabric, typically provide non-uniform heat and develop constant power in the element. In the last case, the metal interconnects are subject to bending and cracking thereby causing heater failure. In all cases, conductive polymers that are not PTC require controls and when PTC inks are used, they are subject to NTC failure or burn out together with poor self-regulation due to their small resistance multiplication.

Fabrics with heating elements woven like threads into the fabric constitute yet another class. Wires have been woven into the fabric as described in U.S. Pat. No. 1,703,005 A. In Pat. No. GB 2,092,868 A, a metallized woven fabric is described, its purpose being to solve the problem of stretching. In most cases described, a simple voltage regulator adjusts temperature level with no feedback control. Also, the woven wires are problematic for making good electrical connections. They are subject to damage because their small size is determined by the electrical resistance necessary to generate low power and not the robustness of the fabric.

U.S. Pat. No. 7,151,062 B2 describes a woven fabric with yarns coated with conductive polymers including PTC ink comprising coated spheres. The PTC ink described is subject to the deficiencies of common PTC inks as described above.

US '062 also claims wire conductors to serve as interconnects cross-woven to the conductive yarns.

SUMMARY

In one aspect, there is disclosed a thermal substrate comprising a substrate and a high-resistance magnification (HRM) PTC ink and a substrate, wherein the HRM PTC ink that has a positive temperature coefficient (PTC) and a resistance magnification of at least 15 in a temperature range of at least 20 degrees Celsius above a switching temperature of the HRM PTC ink.

In another aspect, there is disclosed an article comprising a heater, the heater comprising a HRM PTC ink deposited on a flexible substrate to form one or more resistors; wherein: the substrate is thermal polyurethane, nylon, or a polyester blend. The HRM PTC ink may be deposited on to the substrate by screen printing. In some embodiments, the substrate is thermal polyurethane. In some embodiments, the heater is encapsulated by a dielectric ink or a thin film. The heater may further comprise a plurality of conductive traces; the plurality of conductive traces can be each silver traces.

In another aspect, there is disclosed a panel comprising an encapsulated heater, the heater comprising: a double-resin ink having a positive temperature coefficient (PTC) deposited on a flexible substrate to form one or more resistors, the double-resin ink comprising a first resin comprising a crystalline or a semi-crystalline polymer; and a second resin comprising a non-crystalline polymer; wherein the substrate is thermal polyurethane; and the heater is encapsulated in a dielectric ink. In some embodiments, the heater is encapsulated by a dielectric ink or a thin film. The heater may further comprise a plurality of conductive traces; the plurality of conductive traces can be each silver traces.

In another aspect, there is disclosed an article comprising a heater, the heater comprising: a double-resin ink having a positive temperature coefficient (PTC) deposited on a flexible substrate to form one or more resistors; wherein: the flexible substrate is thermoplastic polyurethane, nylon, or a polyester blend; the double-resin ink comprises: a first resin comprising a crystalline or a semi-crystalline polymer; and a second resin comprising a non-crystalline polymer, wherein the first resin provides a first PTC effect in a first temperature range and the second resin provides a second PTC effect in a second temperature range, the second temperature range being higher than the first temperature range; and the double-resin ink has a resistance magnification of at least 20 in a temperature range of at least 20° C. above a switching temperature of the double-resin ink, the resistance magnification being defined as a ratio between a resistance of the double-resin ink at a temperature 'T' and a resistance of the double-resin ink at 25° C.

The resistance magnification of the HRM PTC ink may be at least 20, 30, 40, 50, 60, 70, 80, 90, 100, 120, 140, 160, 180 or 200. In addition, the temperature range may be 25 degrees Celsius, 30 degrees Celsius, 35 degrees Celsius or 40 degrees Celsius above the switching temperature. Furthermore, the switching temperature of the HRM PTC ink may be between 0 and 160 degrees Celsius.

As an example, the HRM PTC ink may be a double resin ink that comprises: a first resin that provides a first PTC effect in a first temperature range; and a second resin that provides a second PTC effect in a second temperature range, wherein the second temperature range is higher than the first temperature range.

As an example, the double-resin HRM PTC ink may comprise about 10-30 wt % conductive particles; about 5-15 wt % of a first polymer resin; about 5-15 wt % of a second polymer resin; about 40-80 wt % of an organic solvent; and about 0-5 wt % other additives. The conductive particles can be one of, or a mixture of: a metallic powder, a metal oxide, carbon black and graphite. The first polymer resin may be a kind of crystalline or semi-crystalline polymer, such as polyurethane, nylon, and polyester. The second polymer resin may be a kind of non-crystalline polymer, such as acrylic resin. The selection of the solvent is based on its proper boiling point and the solubility of polymer resins since the polymer resins are completely dissolved in the organic solvent prior to blending with other components. Any organic, inert liquid may be used as the solvent for the so long as the polymer is fully solubilized. As examples, the solvent may be selected from MEK, N-methyl pyrolidone (NMP), toluene, xylene, and the like. The other additives include a dispersing/wetting additive and a rheology additive.

As an example of the double resin composition, the HRM PTC ink may comprise about 5-15 wt % of a thermally active polymer resin-1 having a melting point of 30-70° C. and providing a first temperature coefficient characteristic in the first temperature range below 70° C.; about 5-15 wt % thermally active polymer resin-2 having a melting point of 70-140° C. and providing a second positive temperature coefficient characteristic in the second temperature range above 70° C.; about 10-30 wt % conductive particles; about 40-80 wt % organic solvent having a boing point higher than 100° C., the organic solvent being capable of dissolve both the polymer resin-1 and polymer resin-2, and about 0-5 wt % additives. The additives may comprise dispersing additives, wetting additives, and rheological additives, with the additives having enhanced dispersing/wetting and rheology properties. The first polymer resin may be a kind of crystalline or semi-crystalline polymer, such as polyurethane, nylon, and polyester. The second polymer resin may be a kind of non-crystalline polymer, such as acrylic resin.

The thermal substrate may be a fabric, a mesh, or a film.

Furthermore, the HRM PTC ink may be deposited onto the substrate. Non-limiting examples of deposition method include screen printing, use of a thick film dispenser or a 3-D printer.

Where the substrate is a fabric or mesh, deposition of the HRM PTC ink may provide a printed circuit with resistors in parallel. In this case, the thermal substrate may further comprise electrical interconnects that comprise at least one of a metal paste, a metal foil, a metal alloy, aluminum, copper, nickel, and a high-conductivity electronic polymer.

In other embodiments of the thermal substrate, the HRM PTC ink may be deposited on at least one insulating thread, yarn or filament that is incorporated into a fabric or mesh. An insulator can seal the HRM PTC ink.

In other embodiments of the thermal substrate, the HRM PTC ink may be deposited on at least one conducting thread, yarn or filament that is incorporated into a fabric or mesh, with the HRM PTC ink sealed on an outer surface thereof with a conductor. An insulating layer may be applied to the conductor.

In other embodiments, the substrate may be a film. The film may be a polymer selected from the group consisting of polyethylene terephthalate (PET), polyethylene (PE), aluminum and steel (for meshes), glass composite, molded plastic, high-density polyethylene (HDPE) and styrene ethylene butylene styrene (SEBS). As with the other embodiments, the thermal substrate may comprise electrical interconnects that comprise at least one of a metal paste, a metal foil, a metal alloy, aluminum, copper, nickel, and a high-conductivity electronic polymer. An optional layer of a second film may be laminated onto the HRM PTC ink.

Additional features and advantages are realized through the techniques of the present invention. Other embodiments and aspects of the invention are described in detail herein and are considered a part of the claimed invention.

The recitation herein of desirable embodiments is not meant to imply or suggest that any or all of these embodiments are present as essential features, either individually or collectively, in the most general embodiment of the present invention or in any of its more specific embodiments.

BRIEF DESCRIPTION OF DRAWINGS

The foregoing and other advantages of the disclosure will become apparent upon reading the following detailed description and upon reference to the drawings.

Figure 1:
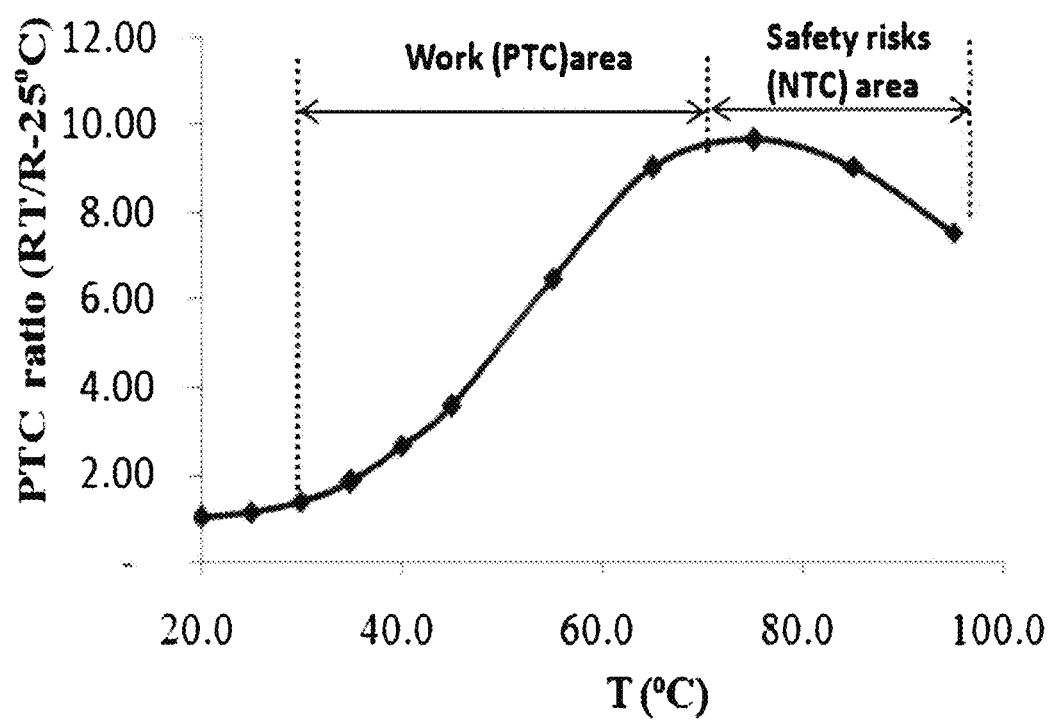
FIG. 1 shows the relationship of the PTC ratio $R_T/R_{25}$ versus temperature T of a typical PTC composition.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION OF PREFERRED EMBODIMENTS

FIG. 1 shows the relationship of the PTC ratio $R_T/R_{25}$ versus temperature T of a typical PTC ink composition. When the temperature T is in excess of 70° C., the PTC ratio $R_T/R_{25}$ (also known as a "resistance magnification" or "resistivity magnification") begins to decline. The PTC ratio $R_T/R_{25}$ is defined as the ratio between a resistance $R_T$ at temperature T and the resistance $R_{25}$ at temperature 25° C. The lower resistance at the onset of NTC leads to excessive current flow and the heating element is overpowered. Therefore, the NTC temperature region is a potential safety-risk temperature region.

Figure 2:
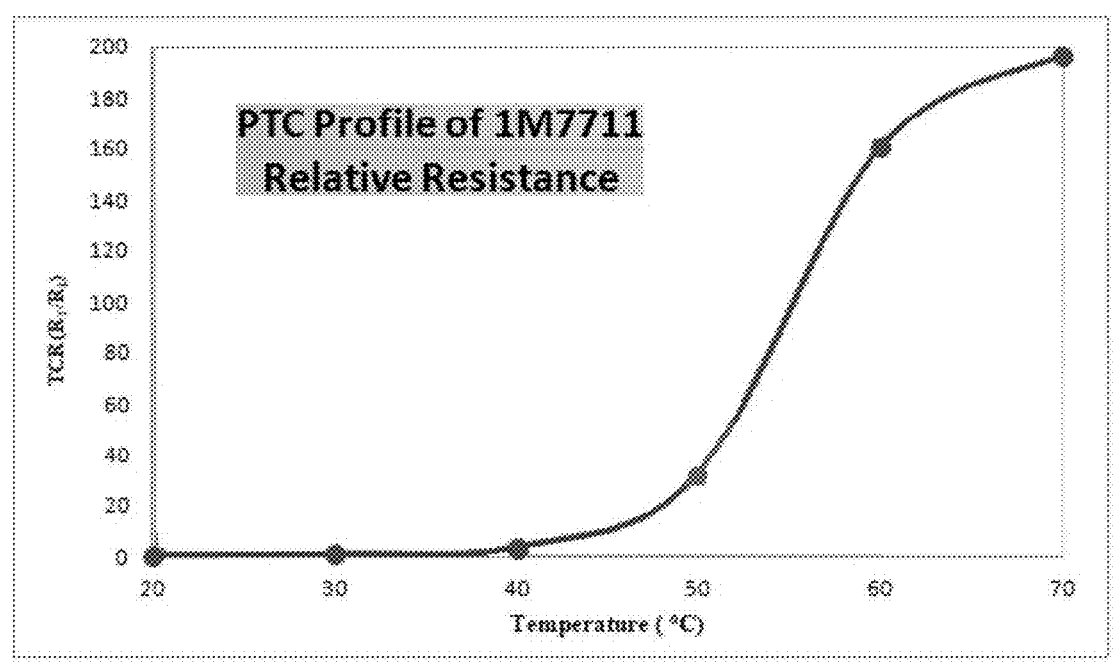
FIG. 2 shows the relative resistance magnification of a high-resistance magnification (HRM) PTC ink that exhibits an upper resistance magnification greater than 200 above a temperature of 70 Celsius.

FIG. 2 shows the relative resistance magnification of a high-resistance magnification (HRM) PTC ink suitable for applications in the present disclosure. The HRM PTC ink exhibits the following properties: its switching temperature is at about 40° C.; its resistance magnification (or PTC ratio $R_T/R_{25}$) rises to about 200 within 30° C. of the switching temperature; and it exhibits only PTC behavior 30° C. beyond the switching temperature. That is, within a span of 30° C. above the switching temperature, the current flowing through the HRM PTC ink is reduced by a factor of 200, thereby providing a self-regulating mechanism by which the power consumption is reduced by 200. In fact, further investigation reveals that the HRM PTC ink has an upper resistance magnification greater than 200 above a temperature of 70° C. Furthermore, no NTC effect is observable 30° C. above the switching temperature, implying use of the HRM PTC ink is safe within this temperature range.

For example, common commercially available PTC inks typically manifest a resistance multiplication of 10-15, as shown in FIG. 1. On the other hand, the resistance magnification of an HRM PTC ink reaches 200 as shown in FIG. 2.

Moreover, the NTC effect is well above the switching temperature as compared to the NTC effect depicted in FIG. 1. In addition, hysteresis effects are absent, transition regions are short and resistance recovery times are short. Finally, the slope of the curve for the HRM PTC ink in FIG. 2 is steeper than that depicted in FIG. 1, which allows more tightly controlled temperature regulation.

These properties imply that the HRM PTC ink of FIG. 2 may be used in applications where a PTC effect, along with a high resistance magnification (i.e. power consumption reduction) are required between about 40° C. and 70° C. The high resistance magnification can be greater than 50, or greater than 100, or greater than 150, in the temperature range of interest.

It follows that applications that require a PTC effect and high magnification resistance in a different temperature range can use an HRM PTC ink with a) a switching temperature; b) PTC effect; and c) high resistance magnification in the required temperature range.

An example of an HRM PTC ink is disclosed in US Pat. Pub. No. 20170327707, incorporated herein by reference. However, as discussed above, any HRM PTC ink that exhibits substantially similar characteristics may be used. The requisite HRM PTC ink exhibits a switching temperature, high resistance magnification and a PTC effect over the temperature range required for the application.

For example, the HRM PTC ink may comprise a first resin that provides a first PTC effect in a first temperature range and a second resin that provides a second PTC effect in a second temperature range, wherein the second temperature range is higher than the first temperature range.

As an example, the double-resin HRM PTC ink may comprise about 10-30 wt % conductive particles; about 5-15 wt % of a first polymer resin; about 5-15 wt % of a second polymer resin; about 40-80 wt % of an organic solvent; and about 0-5 wt % other additives. The conductive particles can be one of, or a mixture of: a metallic powder, a metal oxide, carbon black and graphite. The first polymer resin may be a kind of crystalline or semi-crystalline polymer, such as polyurethane, nylon, and polyester. The second polymer resin may be a kind of non-crystalline polymer, such as acrylic resin. The selection of the solvent is based on its proper boiling point and the solubility of polymer resins since the polymer resins are completely dissolved in the organic solvent prior to blending with other components. Any organic, inert liquid may be used as the solvent for the so long as the polymer is fully solubilized. As examples, the solvent may be selected from MEK, N-methyl pyrolidone (NMP), toluene, xylene, and the like. The other additives include a dispersing/wetting additive and a rheology additive.

As an example of the double resin composition, the HRM PTC ink may comprise about 5-15 wt % of a thermally active polymer resin-1 having a melting point of 30-70° C. and providing a first temperature coefficient characteristic in the first temperature range below 70° C.; about 5-15 wt % thermally active polymer resin-2 having a melting point of 70-140° C. and providing a second positive temperature coefficient characteristic in the second temperature range above 70° C.; about 10-30 wt % conductive particles; about 40-80 wt % organic solvent having a boing point higher than 100° C., the organic solvent being capable of dissolve both the polymer resin-1 and polymer resin-2, and about 0-5 wt % additives. The additives may comprise dispersing additives, wetting additives, and rheological additives, with the additives having enhanced dispersing/wetting and rheology properties. The first polymer resin may be a kind of crystalline or semi-crystalline polymer, such as polyurethane, nylon, and polyester. The second polymer resin may be a kind of non-crystalline polymer, such as acrylic resin.

Thermal Substrate

In a thermal substrate comprising a substrate and an HRM PTC ink, the HRM PTC ink can provide the elimination of NTC and therefore avoid catastrophic failure. Moreover, the high resistivity of the HRM PTC ink in a temperature window of 20° C. to 40° C. above the switch temperature can provide precise temperature self-regulation with rapid time-to-temperature.

Non-limiting examples of a substrate include a fabric, a mesh, and a film.

The present disclosure describes applications of the HRM PTC ink described above that extends or eliminates the onset of the NTC effect, offers magnification factors greater than 15, 25, 50, 100, 150 or 200, and switches in the range of 0°-160° C. Such applications are therefore safer, more reliable and dissipate minimal power at the switch temperature. Moreover, the wide switch temperature range of HRM PTC inks offers greater design flexibility and the steep temperature-resistance transition enables tighter temperature control.

Thermal substrates that use HRM PTC ink may be created using various materials—depending on the specific application. For example, for outdoor wear, a nylon fabric may be used. For an industrial application that requires a higher operating temperature, a woven glass fiber mesh may be used. Similarly, various substrates may be used depending on the parameters of the application. For example, for clothing where low-weight and flexibility are required, thermoplastic polyurethane (TPU), polyester or a natural fabric such as cotton or a cotton blend is appropriate.

In general, all-natural fibers, many polymer films and, in the case of meshes, metal wires are amenable to heating with a HRM PTC ink.

First Embodiment of a Thermal Substrate

In some embodiments, a thermal substrate may be made by deposition of a HRM PTC ink onto a fabric or mesh.

The HRM PTC ink may be deposited on the substrate by various techniques. For example, screen printing onto a substrate may be used successfully because of the favorable dispersion of the HRM PTC ink. Other suitable techniques include gravure or rotogravure (e.g. "doctor blade") methods. The HRM PTC ink may also be dispensed over simple or complex surfaces using nozzles mounted on programmable robots or embedded in components by 3-D printing. Other methods of depositing a HRM PTC ink with substantial accuracy are known in the art.

Once the HRM PTC ink has been deposited on a fabric or mesh, silver or other conductive paste may be deposited on the substrate to create electrical interconnects (e.g. contacts and bus lines) for use in heater applications. In some embodiments, other metals (e.g. metal foils or wires), metal alloys or electrically conductive materials such as, but not limited to, aluminum, copper, nickel and alloys thereof, or highly conductivity electronic polymers may be deposited on the substrate as a paste or ink to create interconnects In all cases, interconnects can be designed for minimal length to lessen the possibility of cracking.

An HRM PTC ink is methodically deposited on a substrate such that the resulting circuit pattern provides for optimum power delivered by the resulting thermal substrate. For any given heating application, whereas the switch temperature is determined by the composition of the HRM PTC ink, the power delivered by the thermal substrate is determined by the HRM PTC ink's circuit pattern.

Figure 3:
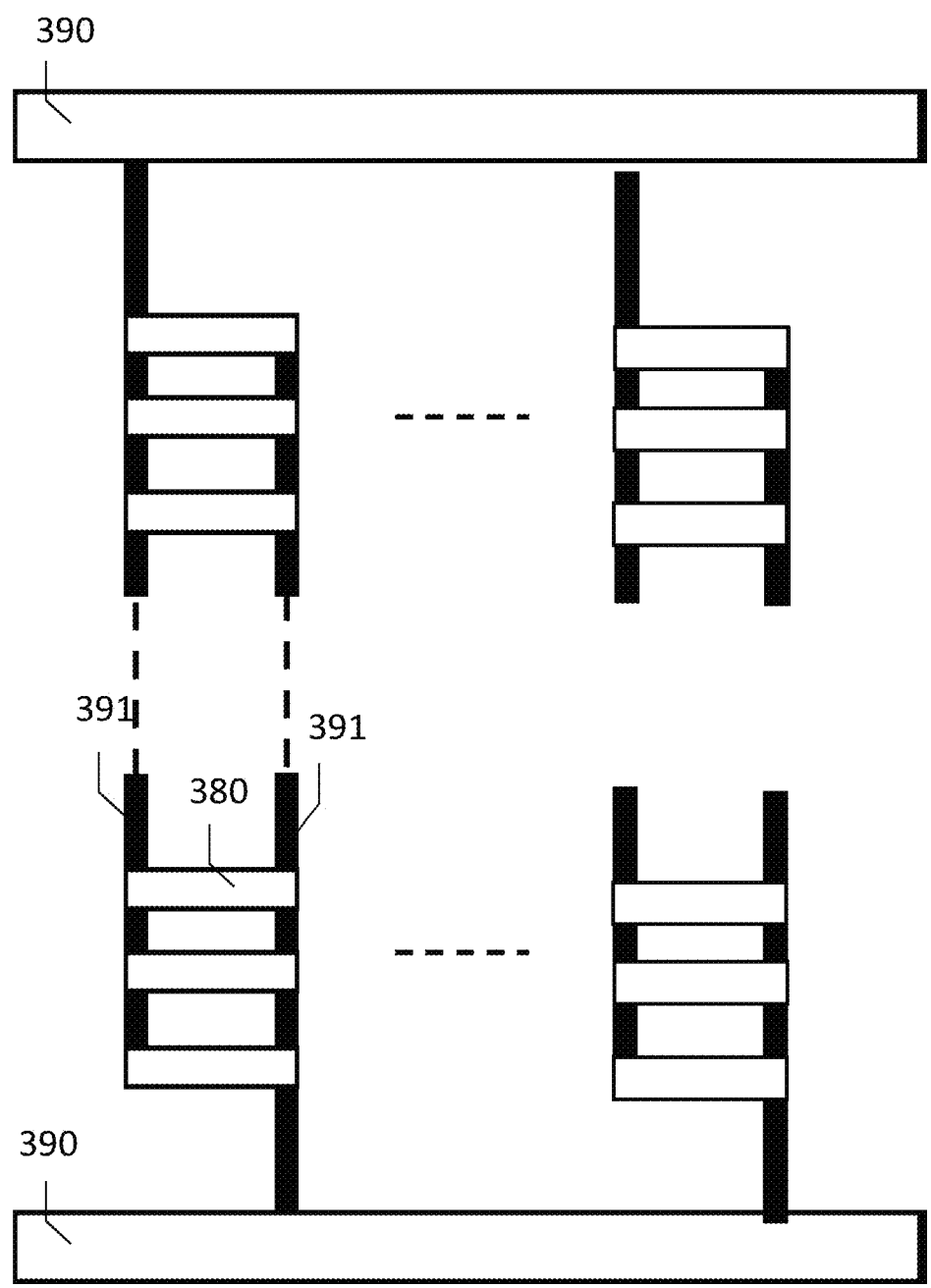
FIG. 3 illustrates an embodiment of a printed circuit that comprises multiple resistors that regulate temperatures independently over each small area covered by each individual resistor.

FIG. 3 depicts a printed circuit that comprises multiple deposits of printed HRM PTC ink. Each deposit of ink 380 acts as a resistor that regulates temperatures independently over a small area covered by the individual resistor 380. Each resistor 380 in a column is powered by line voltage busses 390 and interconnects 391. The printed circuit arises from deposition of the HRM PTC ink and conductive interconnects onto the substrate, as described above.

Since the HRM PTC resistor 380 material typically has high sheet resistance, the power, P, is determined by arranging the printed resistors in parallel in a column on the substrate, as shown in FIG. 3. The power dissipated by a column, $P_{col}$, is:

$$P_{col} = V^2 / R_{col},$$

where V is the applied voltage and $R_{col}$ is the total resistance of the column. If the number of resistors in parallel within a column is $n_{col}$ and the resistance of individual resistor 380 is R, the resistance of the column, $R_{col}$, is:

$$R_{col} = R / n_{col}.$$

For a total of N columns (as depicted in FIG. 3), the total power dissipated by the sheet, P, is $$P = n_{col}NV^2/R.$$

The resistors may have a length of from about 0.2 cm to about 10 cm. The temperature at each resistor is independently regulated. This circuit pattern allows independent temperature control of small areas, controlled power delivery and temperature uniformity, or non-uniformity if desired, over the surface of the substrate regardless of the local thermal load. The gap between discrete resistors may also be reduced to zero to form a contiguous line of resistors with identical behavior of the heater, i.e. local self-regulation in response to local thermal load conditions. In all cases, the resistivity of the HRM PTC ink may be adjusted appropriately.

Second Embodiment of a Thermal Substrate

In other embodiments, the HRM PTC ink may be deposited on a thread, yarn, or mesh element for weaving into a fabric or mesh to create a thermal fabric or mesh.

Figure 4A:
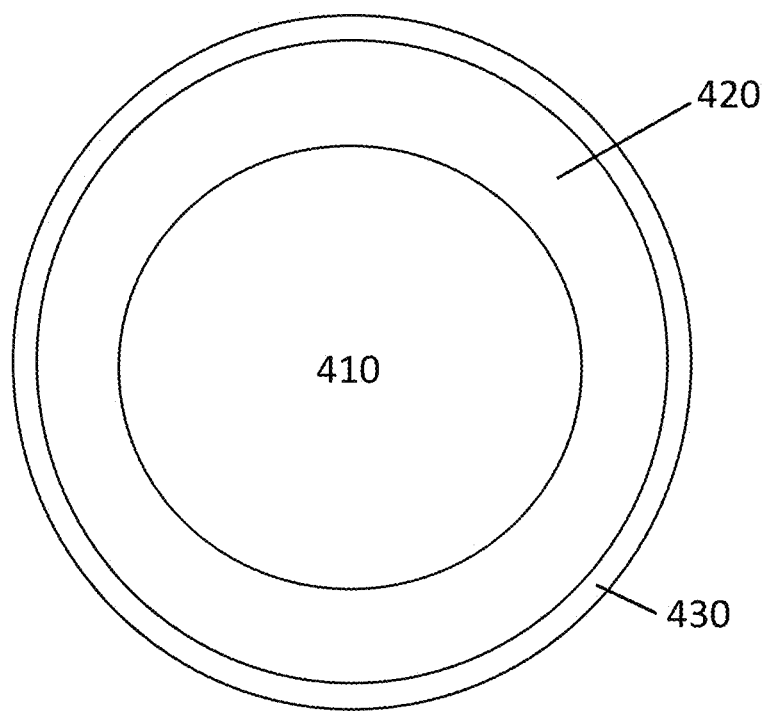
FIG. 4A illustrates a cross-section of an embodiment of a PTC coating on an insulating yarn or filament.

FIG. 4A illustrates a cross-section of an HRM PTC coating 420 on an insulating thread, yarn, or filament 410. The HRM PTC ink is deposited as a coating 420 on the insulating thread, yarn, or filament 410 and preferably sealed for electrical isolation on the outer surface with an insulating polymer 430. Coating and sealing may be done by dipping, extrusion, or vapor deposition. Conduction of current is therefore along the length of the thread, yarn, or filament. In this configuration, the HRM PTC ink is formulated for low resistivity, while multiple coated threads, yarns or filaments may be connected in parallel.

Figure 4B:
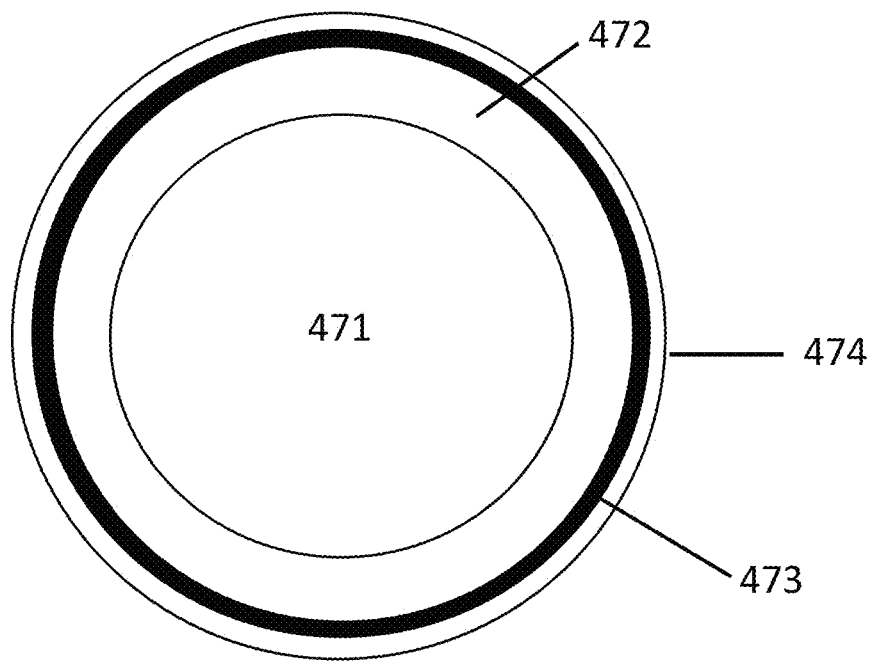
FIG. 4B is a schematic of an embodiment of a mesh or fabric that incorporates an insulating yarn or filament constructed as shown in FIG. 4A.

In another embodiment shown in FIG. 4B, the HRM PTC ink 472 can be deposited on a conductive thread, yarn, or filament 471 (e.g. such as a copper wire) and coated with another electrically conductive layer 473 such as copper or silver. As above, there can be an optional insulating layer 474 around the conductive layer 473. In this case, the HRM PTC ink may be formulated for high resistivity and electrical current flows radially inward from the outer conductive layer 473 to the conductive thread 471.

Figure 4C:
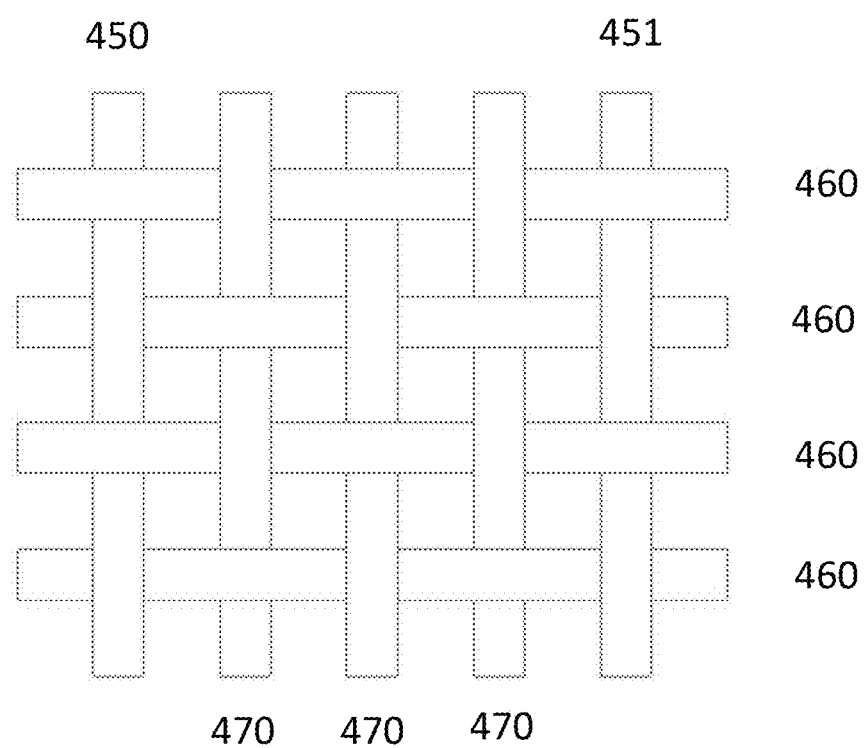
FIG. 4C illustrates a cross-section of an embodiment of a PTC coating on a conductive yarn or filament.

FIG. 4C illustrates an example of how the coated threads 460 may be woven into the weft of a fabric or mesh to form a thermal substrate using an insulator as a thread, yarn, or filament. Wires 450 and 451 carry supply voltage and are woven into the warp. Contact with the heater threads can be made by coating with pressure-sensitive adhesive and subsequently simultaneously applying heat and pressure, pulse welding, swaging, sealing with an overcoat or other means known in the art. The remaining threads 470 in the warp are standard fabric or mesh materials, e.g. polyester.

Figure 4D:
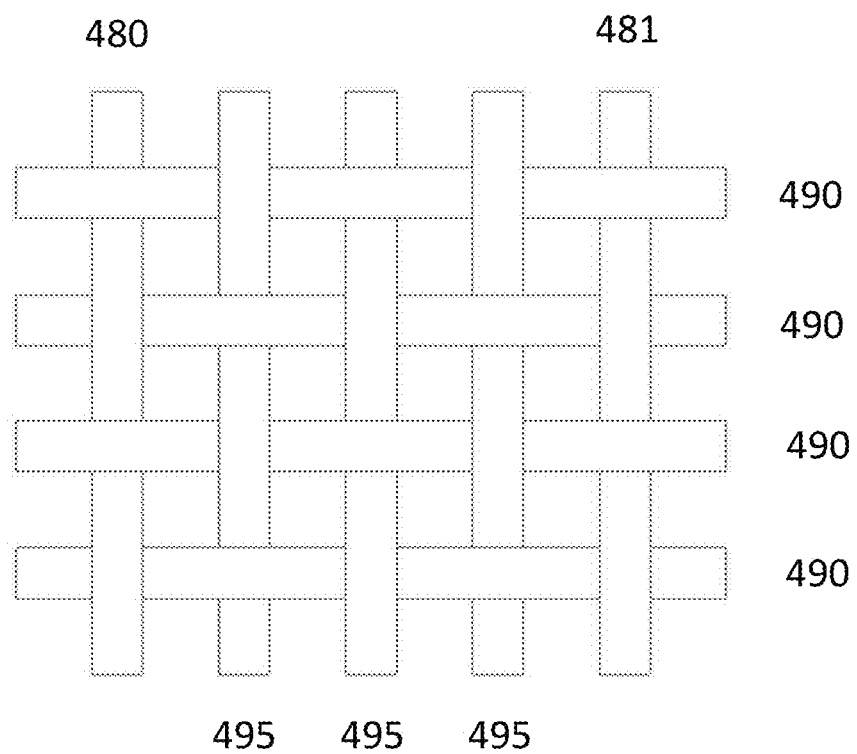
FIG. 4D is a schematic of an embodiment of a mesh or fabric that incorporates a conductive yarn or filament constructed as shown in FIG. 4C.

FIG. 4D is a schematic of a mesh or fabric that incorporates a conductive yarn or filament constructed as shown in FIG. 4C. One wire carrying supply voltage 480 makes contact with the outer conductor layer of the heater threads 490, which constitute the weft; the other wire 481 makes contact with the inner conductor of the coated threads. The remaining threads 495 are the customary fabric material. The inner conductors are exposed by stripping the HRM PTC ink from the threads with solvent or mechanical means.

Third Embodiment of a Thermal Substrate

Figure 5A:
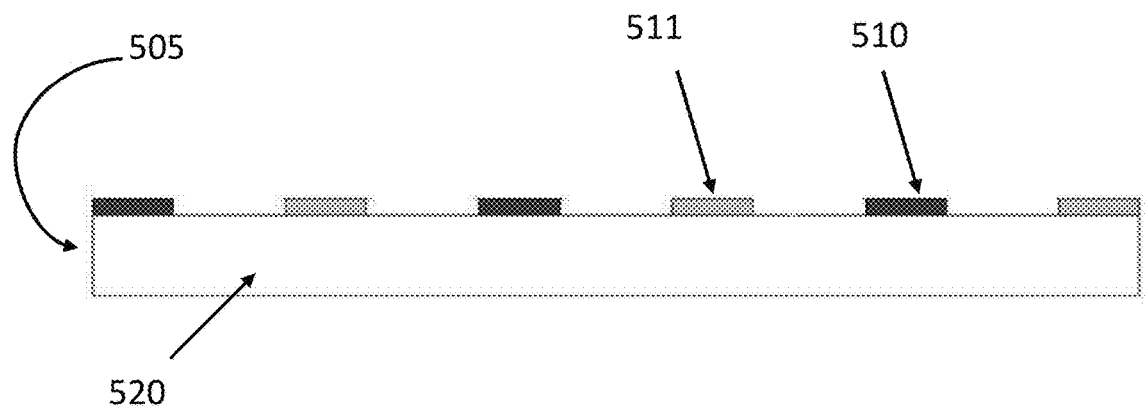
FIGS. 5A and 5B are each a schematic cross section of a PTC ink and interconnects deposited on a film (FIG. 5A) and subsequently laminated (FIG. 5B).
Figure 5B:
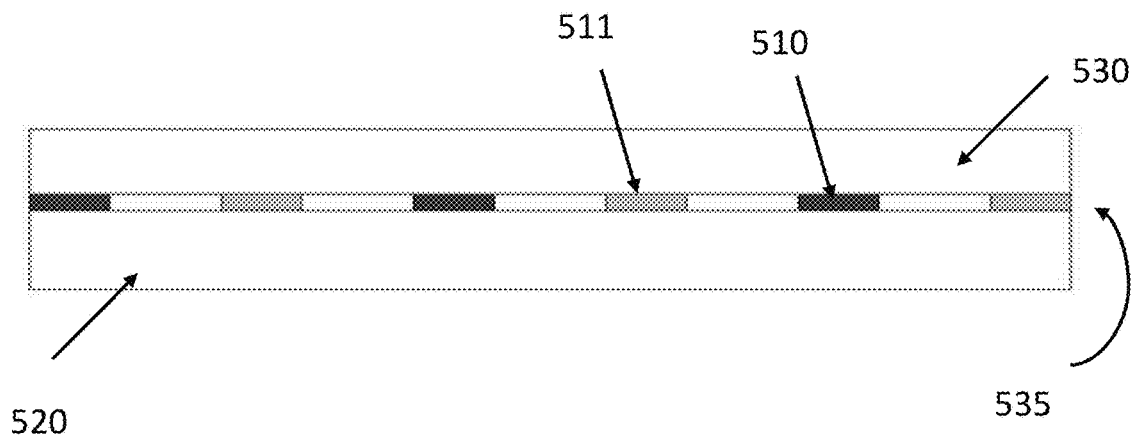

In yet another embodiment a thermal substrate 505 may be made by depositing the HRM PTC ink 510 and conductive interconnects 511 onto a polymer film 520, as shown in FIG. 5A. The printed elements may be subsequently encapsulated by optionally laminating a second film 530 of the same composition (as that of film 520), resulting in a laminated thermal substrate 535, as shown in FIG. 5B. Lamination may be achieved by using a pressure and temperature adhesive. Suitable substrate and encapsulation materials include, but are not limited to: polyester, polyimide, polypropylene, rubber, silicone, thermoplastic polyurethane, laminates, ethylene-vinyl acetate (EVA) adhesive film, acrylate adhesive film and silicon adhesive film, fabric, silicone, and polyethylene terephthalate (PET). Additionally, the fabric or mesh heated by the thermal substrate 505 may have other layers of materials bonded to it such as, but not limited to: adhesive films, thermal barriers, reflective films, high or low emissivity films, absorptive films, alkaline resistant films, ground planes or EMI/RFI protective layers.

Figure 5C:
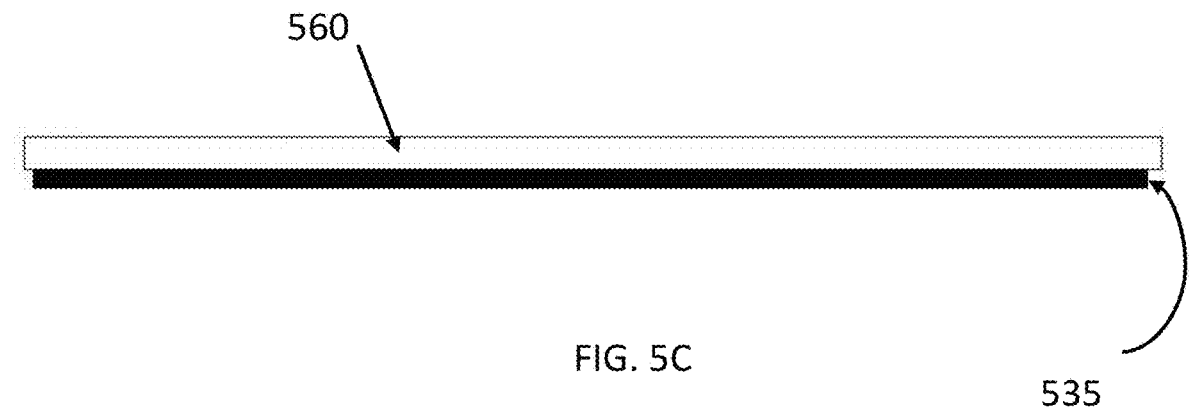
FIGS. 5C-5F are each a schematic cross section of a laminated HRM PTC thermal substrate positioned in thermal communication with a fabric or mesh.

If the primary heat transfer mechanism is conduction, the laminated thermal substrate 535 can be positioned in thermal communication with a fabric or mesh 560 in order to heat the fabric or mesh 560, as shown in FIG. 5C. In the embodiment shown, the laminated thermal substrate 535 may be merely positioned close to the fabric or mesh 560 to be in contact therewith. While laminated thermal substrate 535 (of FIG. 5B) is shown, thermal substrate 505 (of FIG. 5A) may be used in place of the laminated thermal substrate 535.

Figure 5D:
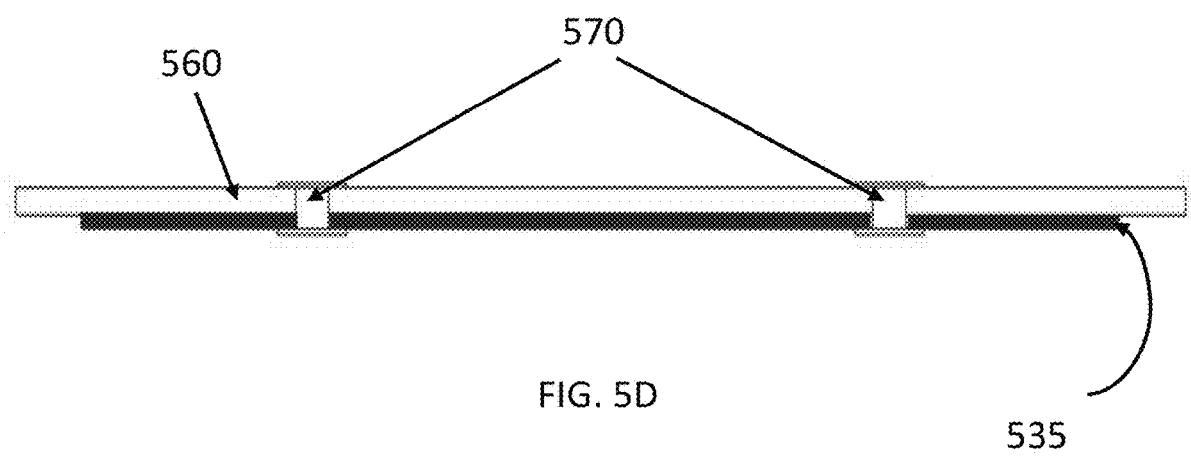

Alternatively, the laminated thermal substrate 535 may be attached to the fabric or mesh 560 by a fastener 570 (such as, but not limited to: a rivet, snap, clasp or stud), as shown in FIG. 5D, or by various other means such as adhesives, sewing or removable clips. While laminated thermal substrate 535 (of FIG. 5B) is shown in in FIG. 5C, the thermal substrate 505 (of FIG. 5A) may be used in place of the laminated thermal substrate 535.

Figure 5E:
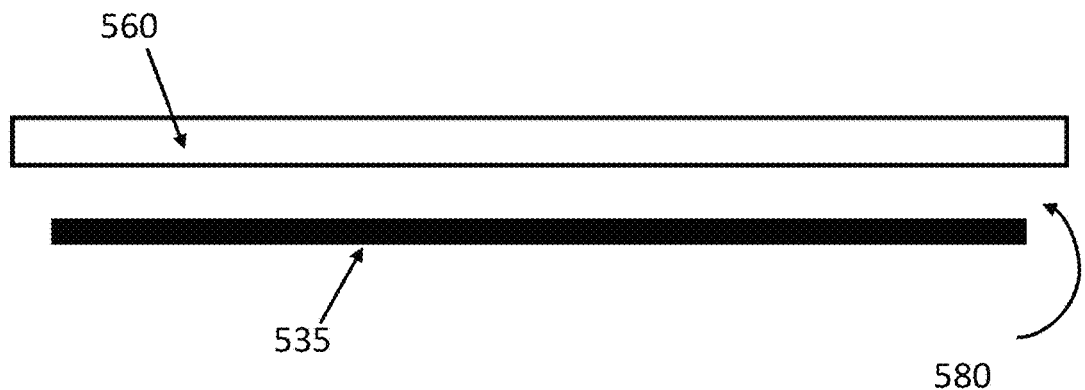

If the primary mode of heat transfer is infrared radiation or convection, the laminated thermal substrate 535 may not need to be proximate to the fabric or mesh 560. Then, an air gap 580 may be configured, as shown in FIG. 5E, between the laminated thermal substrate 535 and the fabric or mesh 560. While laminated thermal substrate 535 (of FIG. 5B) is shown, the thermal substrate 505 (of FIG. 5A) may be used in place of the laminated thermal substrate 535.

Figure 5F:
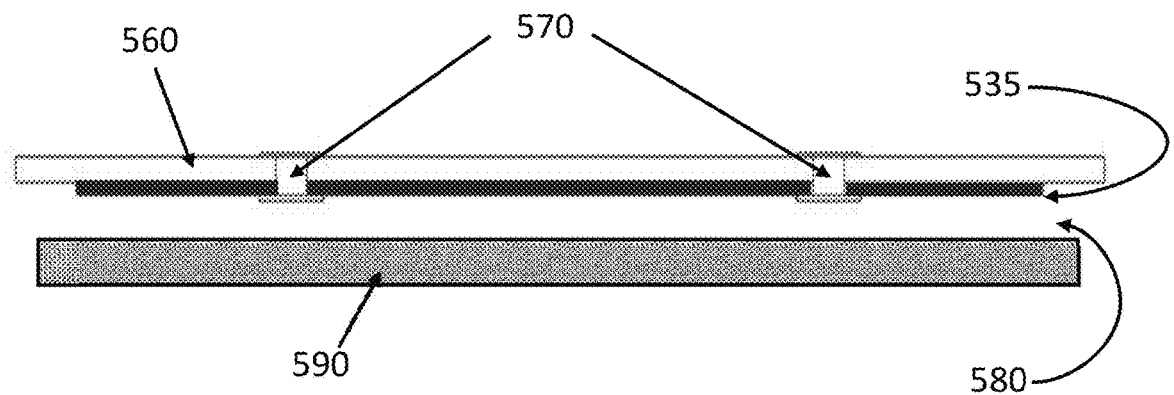

Whether the laminated thermal substrate 535 (or thermal substrate 505) is adjacent to the mesh or fabric 560 (as in FIG. 5C), fastened to the mesh or fabric 560 (as in FIG. 5D), or separated from the mesh or fabric 560 by an air gap 580 (as in FIG. 5E), an optional layer of material may be used for thermal insulation, water proofing, etc. FIG. 5F illustrated a configuration where a laminated thermal substrate 535 is fastened to a mesh or fabric 560, and placed near a layer of material 590, with an air gap 580. For example, in an embodiment, a heated jacket can have a fabric lining that has an HRM PTC film attached thereto, along with a waterproof fabric that forms an outer layer of the jacket.

In various applications, the fabric or mesh heated by the thermal film may have a sensor positioned proximate to it or laminated in it, Furthermore, it may use a feedback loop to adjust its temperature based on the sensor. In other applications, the HRM PTC ink itself may be used as its own temperature sensor since it manifests such a strong and repeatable relationship between resistance and temperature. In such an application, an auxiliary circuit may be configured to measure real-time heater resistance for an accurate temperature integrated over the entire thermal film.

Application: Body Warming/Pain Relief

A flexible heater comprising a HRM PTC deposited on a flexible substrate may be used as an article for body warming and/or pain relief applications such as, but not limited to, heating pads, heat wraps, heated blankets, heated throws, heated body pillows and heated mattress pads.

The HRM PTC ink has a positive temperature coefficient (PTC) and a resistance magnification of at least 15 in a temperature range of at least 20 degrees Celsius above a switching temperature of the HRM PTC ink. The resistance magnification of the HRM PTC ink may be at least 20, 30, 40, 50, 60, 70, 80, 90, 100, 120, 140, 160, 180 or 200. In addition, the temperature range may be 25 degrees Celsius, 30 degrees Celsius, 35 degrees Celsius or 40 degrees Celsius above the switching temperature. Furthermore, the switching temperature of the HRM PTC ink may be between 0 and 160 degrees Celsius. As an example, the HRM PTC ink may be a double resin ink that comprises: a first resin that provides a first PTC effect in a first temperature range; and a second resin that provides a second PTC effect in a second temperature range, wherein the second temperature range is higher than the first temperature range.

In some embodiments, the first temperature range is between 30 C-70 C. Suitable substrates for this application are low-weight and flexible, and can include for example, thermoplastic polyurethane (TPU) or fabric itself such as polyester blend or nylon.

The advantage of using HRM PTC heaters is the elimination of a temperature sensor, elimination of controller or power supply, elimination of physical connectors (e.g. wires), excellent temperature uniformity and efficiency. The latter advantage arises from the HRM PTC ink being formulated to switch at a desired level, as well as the layout/design of the article. In addition, the article can achieve heating temperatures with lower voltage. In addition, the article can be laundered.

Figure 6:
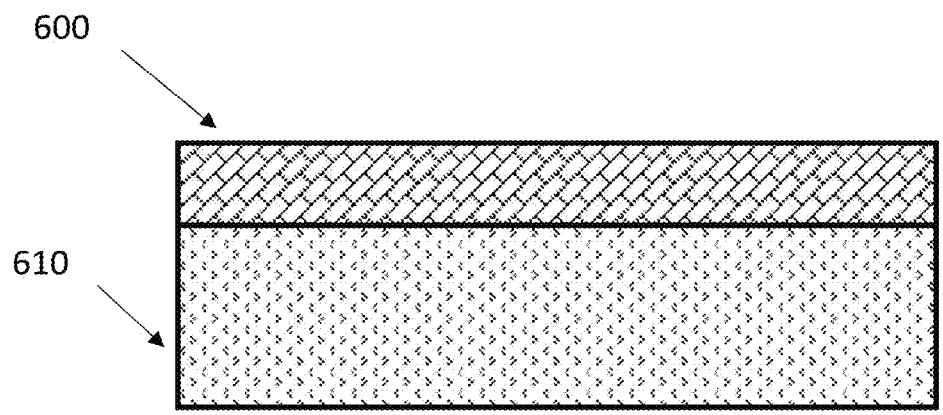
FIG. 6 is a cross sectional view of a heater used in a body warming/pain relief application according to an embodiment.
Figure 7:
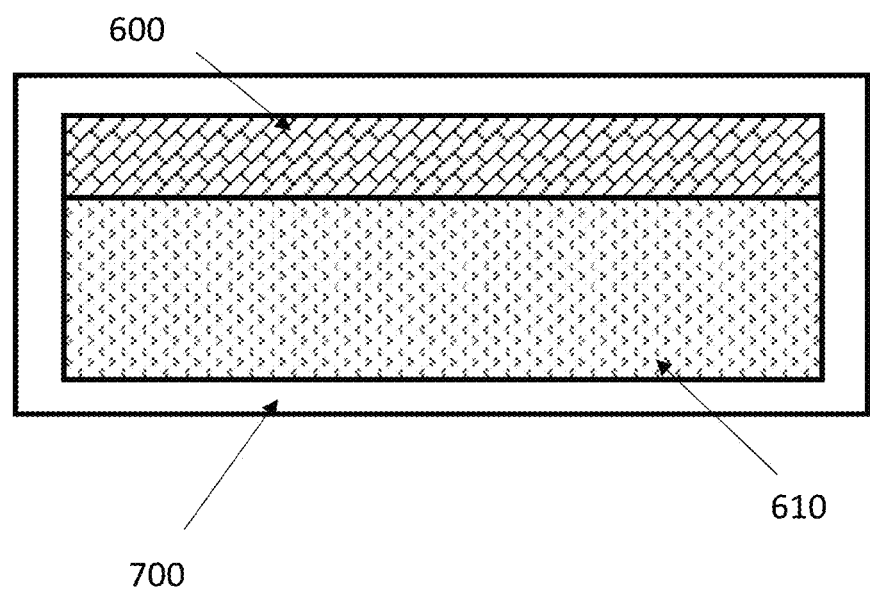
FIG. 7 is a cross sectional view of a heater used in a body warming/pain relief application according to an embodiment.

In some embodiments, the HRM PTC ink 600 is deposited onto a TPU substrate 610 using a method of screen printing, as shown in FIG. 6. In some embodiments, the HRM PTC ink/TPU substrate assembly (i.e. the flexible heater) is cured using heat, and then encapsulated in an encapsulation material 700, as shown in FIG. 7. Suitable encapsulation materials for use in this application include a dielectric ink or other thin film. In some embodiments, the encapsulated heater is inserted, sewn, or otherwise attached to a fabric or shell (that is placed adjacent to a user) to form the article for body warming and/or pain relief.

Figure 8:
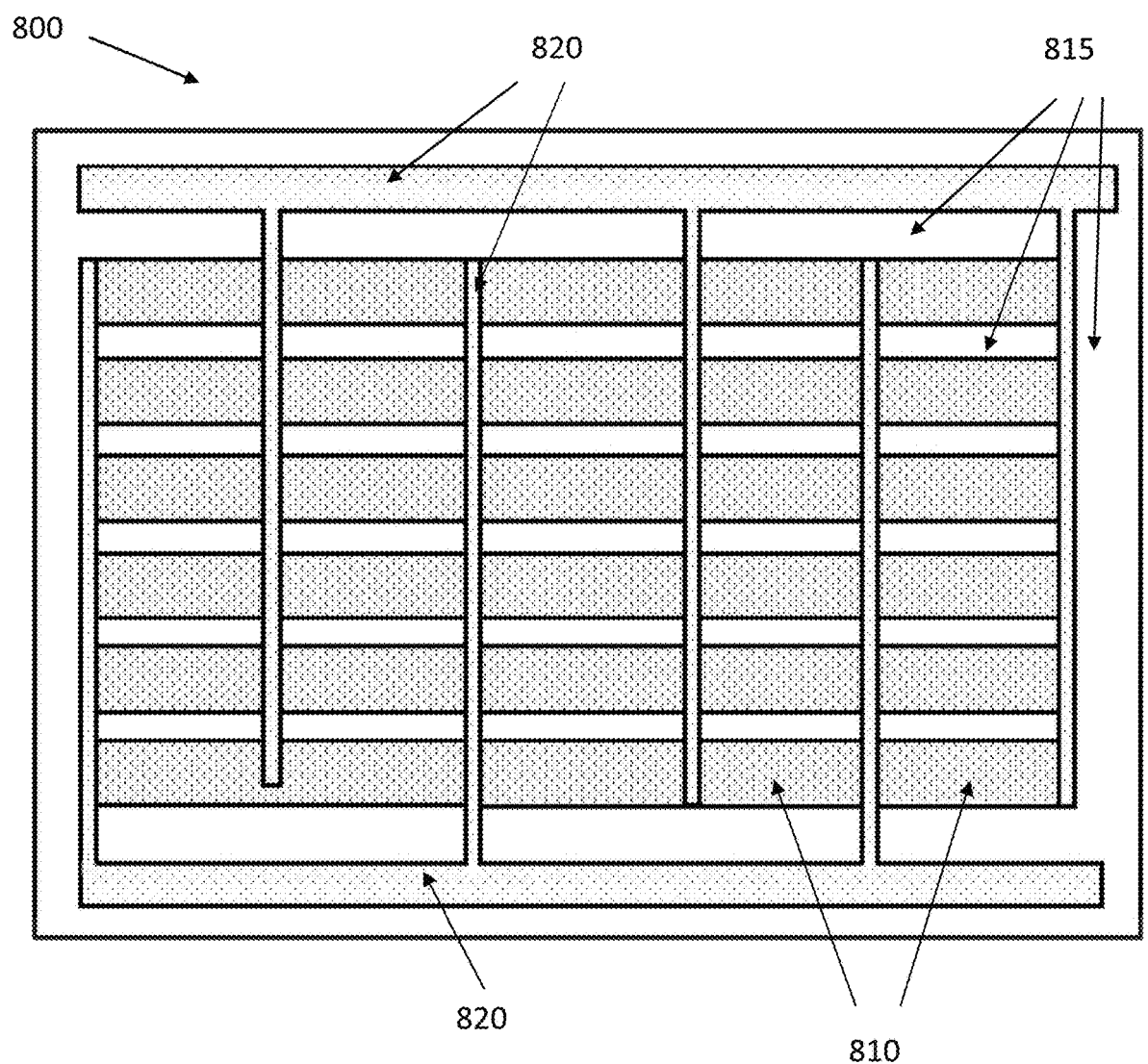
FIG. 8 is a plan view of a used in a body warming/pain relief application according to an embodiment.

FIG. 8 is a plan view of a heater used in a body warming/pain relief application according to an embodiment of the present invention. FIG. 8 illustrates a thin film panel 800 comprising a HRM PTC ink 810 screen printed onto a TPU substrate 815, cured with heat, and encapsulated with a dielectric ink (not shown). Panel 800 also comprises a series of printed conductive traces 820 that are screen printed onto the TPU, cured, and laminated with a dielectric ink. The conductive traces 820 are designed to carry the electrical current. In FIG. 8, the conductive traces 820 run perpendicular through the printed HRM PTC ink, which creates a plurality of individual resistors 810 that generate heat. Each individual resistor is also self-regulating due to the properties of the HRM PTC ink properties. Furthermore, the HRM effect of the ink relate to the ability of each individual resistor resisting the electrical current enough to prevent at least one of overheating, fires, and failure. In some embodiments, printed silver traces are used.

In one example of body warming/pain relief application, a HRM PTC ink was deposited onto a TPU substrate using a method of screen printing. A voltage of 120 VAC was applied to the article, resulting in a watt density of between 5-10 watts/ft$^2$, or around 7 watts/ft$^2$. While the article can be any shape, in this example, it was square or rectangular. The square measured from 6 in×6 in to 24 in×24 in, or about 12 in×12 in. The rectangle measured from 6 in×12 in to 18 in×30 in, or about 12 in×24 in. The self-regulating temperature of the double-switching ink was about 60° C. C, while the temperature of the article where applied to a user was about 50° C. to about 55° C. C or about 52° C. In general, an article can be designed to obtain a range of self-regulating temperatures and watt densities, in order to achieve specific metrics required by a customer.

In a second example of body warming/pain relief application, a HRM PTC ink is deposited onto a TPU substrate using a method of screen printing. A voltage of about 11.1 VDC was applied to the article, resulting in a watt density of between 60-70 watts/ft$^2$, or about 65 watts/ft$^2$. While the article can be any shape, in this example, it was square, measuring from 6 in×6 in to 24 in×24 in, or about 12 in×12 in. The self-regulating temperature of the double-switching PTC ink was about 73° C., while the temperature of the article where applied to a user was about 60° C. to about 70° C. or about 65 C ° C. In general, an article can be designed to obtain a range of self-regulating temperatures and watt densities, in order to achieve specific metrics required by a customer.

While particular implementations and applications of the present disclosure have been illustrated and described, it is to be understood that the present disclosure is not limited to the precise construction disclosed herein and that various modifications, changes, and variations can be apparent from the foregoing descriptions without departing from the spirit and scope of an invention as defined in the appended claims.

What is claimed is:

1. An article comprising a heater, the heater comprising:
a double-resin ink having a positive temperature coefficient (PTC) deposited on a flexible substrate to form one or more resistors; wherein:
the flexible substrate is thermoplastic polyurethane, nylon, or a polyester blend;
the double-resin ink comprises: a first resin comprising a crystalline or a semi-crystalline polymer; and a second resin comprising a non-crystalline polymer, wherein the first resin provides a first PTC effect in a first temperature range and the second resin provides a second PTC effect in a second temperature range, the second temperature range being higher than the first temperature range; and
the double-resin ink has a resistance magnification of at least 20 in a temperature range of at least 20° C. above a switching temperature of the double-resin ink, the resistance magnification being defined as a ratio between a resistance of the double-resin ink at a temperature 'T' and a resistance of the double-resin ink at 25° C.

2. The article according to claim 1, wherein the resistance magnification of the double-resin ink is at least 50.

3. The article according to claim 2, wherein the temperature range is 30° C. above the switching temperature.

4. The article according to claim 1, wherein the switching temperature is between 0° C. and 160° C.

5. The article according to claim 1, wherein the double-resin ink comprises:
a) 5-15 wt % of a thermally active first polymer resin having a melting point of 30° C.-70° C. and providing the first PTC effect in the first temperature range below 70° C., b) 5-15 wt % of a thermally active second polymer resin having a melting point of 70° C.-1400° C. and providing the second PTC effect in the first temperature range above 70° C.,
c) 10-30 wt % of conductive particles,
d) 40-80 wt % of an organic solvent having a boiling point higher than 100° C., the organic solvent being capable of dissolving both the first resin and the second resin, and
e) 0-5 wt % of additives comprising a dispersive additive, a wetting additive and a rheological additive, the additives having enhanced dispersing, wetting and rheological properties.

6. The article according to claim 1, wherein the double-resin ink is deposited on to the flexible substrate by screen printing.

7. The article according to claim 1, wherein the flexible substrate is thermal polyurethane.

8. The article according to claim 1, wherein the heater is encapsulated by a dielectric ink or a thin film.

9. The article according to claim 1, wherein the heater further comprises a plurality of conductive traces.

10. The article according to claim 9, wherein the plurality of conductive traces are each silver traces.

11. The article according to claim 1, wherein the article is selected from the group comprising: heating pads, heat wraps, heated blankets, heated throws, heated body pillows, and heated mattress pads.

* * * * *